United States Patent
Hails et al.

(10) Patent No.: US 8,021,914 B2
(45) Date of Patent: Sep. 20, 2011

(54) MANUFACTURE OF CADMIUM MERCURY TELLURIDE

(75) Inventors: Janet E Hails, Malvern (GB); Jean Giess, Malvern (GB); John W Cairns, Malvern (GB); Andrew Graham, Malvern (GB); Louise Buckle, Malvern (GB); David J Hall, Malvern (GB); Neil T Gordon, Malvern (GB)

(73) Assignee: Qinetiq Limited, London (GB)

( * ) Notice: Subject to any disclaimer, the term of this patent is extended or adjusted under 35 U.S.C. 154(b) by 1056 days.

(21) Appl. No.: 10/594,393

(22) PCT Filed: Apr. 5, 2005

(86) PCT No.: PCT/GB2005/001322
§ 371 (c)(1),
(2), (4) Date: Sep. 27, 2006

(87) PCT Pub. No.: WO2005/098097
PCT Pub. Date: Oct. 20, 2005

(65) Prior Publication Data
US 2007/0197022 A1    Aug. 23, 2007

(30) Foreign Application Priority Data
Apr. 6, 2004  (GB) .................................. 0407804.4

(51) Int. Cl.
*H01L 21/00* (2006.01)
(52) U.S. Cl. .................................. 438/95; 257/E31.008
(58) Field of Classification Search .................. 438/479, 438/94, 95, 625; 257/E31.008
See application file for complete search history.

(56) References Cited

U.S. PATENT DOCUMENTS

| 4,566,918 A | 1/1986 | Irvine et al. |
| 4,650,539 A | 3/1987 | Irvine et al. |
| 4,804,638 A * | 2/1989 | Hoke et al. ..................... 117/104 |

(Continued)

FOREIGN PATENT DOCUMENTS

EP    0 619 615 A    10/1994

(Continued)

OTHER PUBLICATIONS deLyon et al, "MBE Growth of HgCdTe on SiliconSubstrates for Large-Area . . . ", Journal of Electronic Materials, vol. 28, No. 6, 1999.

(Continued)

*Primary Examiner* — Matthew Smith
*Assistant Examiner* — Christine Enad
(74) *Attorney, Agent, or Firm* — Nixon & Vanderhye P.C.

(57) ABSTRACT

A method of manufacture of cadmium mercury telluride (CMT) is disclosed. The method involves growing one or more buffer layers on a substrate by molecular beam epitaxy (MBE). Subsequently at least one layer of cadmium mercury telluride, $Hg_{1-x}Cd_xTe$ where x is between 0 and 1 inclusive, is grown by metal organic vapour phase epitaxy (MOVPE). The use of MBE to grow buffer layers allows a range of substrates to be used for CMT growth. The MBE buffer layers provide the correct orientation for later MOVPE growth of CMT and also prevent chemical contamination of the CMT and attack of the substrate during MOVPE. The method also allows for device processing of the CMT layers to be performed with further MOVPE growth of crystalline CMT layers and/or passivation layers. The invention also relates to new devices formed by the method.

18 Claims, 4 Drawing Sheets

U.S. PATENT DOCUMENTS

Figure 1:
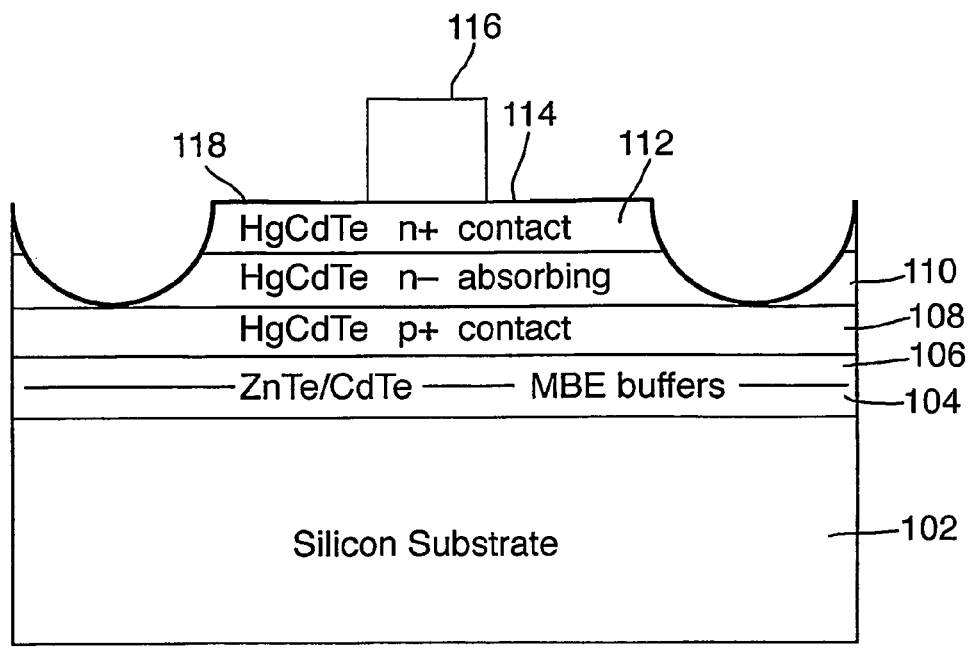

| | | | | |
|---|---|---|---|---|
| 4,910,154 | A | * | 3/1990 | Zanio et al. ............... 438/60 |
| 4,950,621 | A | | 8/1990 | Irvine et al. |
| 4,970,567 | A | | 11/1990 | Ahlgren |
| 5,192,695 | A | * | 3/1993 | Wang et al. ............... 438/87 |
| 5,290,394 | A | * | 3/1994 | Sasaki ............... 117/105 |
| 5,380,669 | A | | 1/1995 | Norton |
| 5,608,208 | A | | 3/1997 | Nemirovsky |
| 5,742,089 | A | * | 4/1998 | Rajavel et al. ............ 257/442 |
| 5,759,266 | A | | 6/1998 | Kawano |
| 5,838,053 | A | * | 11/1998 | Bevan et al. ............ 257/442 |
| 6,045,614 | A | | 4/2000 | de Lyon et al. |
| 6,657,194 | B2 | | 12/2003 | Ashokan et al. |
| 7,026,228 | B1 | * | 4/2006 | Hails et al. ............... 438/509 |
| 2003/0102432 | A1 | * | 6/2003 | Boieriu et al. ............ 250/338.4 |

FOREIGN PATENT DOCUMENTS

| | | |
|---|---|---|
| FR | 2763608 A1 | 11/1998 |
| GB | 2 202 236 A | 9/1988 |
| JP | 64-002375 | 1/1989 |
| JP | 03171634 A | 7/1991 |
| JP | 04-193793 | 7/1992 |
| JP | 05267198 A | 10/1993 |
| JP | 05315580 A | 11/1993 |
| JP | 06177038 A | 6/1994 |
| JP | 06267998 A | 9/1994 |
| JP | 07-014767 | 1/1995 |
| JP | 07240374 A | 9/1995 |
| JP | 07335929 A | 12/1995 |
| JP | 08107068 A | 4/1996 |
| WO | 01/20687 A1 | 3/2001 |

OTHER PUBLICATIONS

Ebe et al, "Direct Growth of CdTe on (100), (211), and (111) Si by Metalorganic . . . ", Journal of Electronic Materials, vol. 25, No. 8, 1996.

Maruyama et al, "Growth of (111) HgCdTe on (100) Si by MOVPE Using . . . ", Journal of Electronic Materials, vol. 25, No. 8, 1996.

Phillips et al, "Control of Very-Long-Wavelength Infrared HgCdTe . . . ", Journal of Electronic Materials, vol. 31, No. 7, 2002.

Zandian et al, "Mid-Wavelength Infrared p-on-n $Hg_{1-x}CD_xTe$ Heterostructure . . . ", Journal of Electronic Materials, vol. 32, No. 7, 2003.

Shigenaka et al, "Orientation Dependence of HgCdTe Epitaxial Layers . . . ", Journal of Electronic Materials, vol. 25, No. 8, 1996.

International Search Report of PCT/GB2005/001322, mailed Aug. 25, 2005.

GB Search Reports for GB 0407804.4, dated Jul. 15, 2004 and Jan. 14, 2005.

Nouhi et al.; "Molecular Beam Epitaxy and Metalorganic Chemical Vapor Deposition Growth of Epitaxial CDTE on (100) GAAS/SE and (111) GAAS/SI Substractes", Applied Physics Letters, American Institute of Physics, vol. 52, No. 24, Jun. 13, 1988, pp. 2028-2030, XP000020280.

Johnson et al; "Direct Growth of CDZNTE/SI Substrates for Large-area HGCEDTE Infrared Focal Plane Arrays", Journal of Electronic Materials, vol. 24, No. 5, May 1, 1995, pp. 467-473, XP000571373.

Hall et al; "High-Performance Long-Wavelength HGCDTE Infrared Detectors Grown on Silicon Substrates", Applies Physics Letters, Institute of Physics, vol. 85, No. 11, Sep. 13, 2004, pp. 2113-2115, XP001226600.

* cited by examiner

MANUFACTURE OF CADMIUM MERCURY TELLURIDE

This application is US national phase of internation application PCT/GB2005/001322, filed 5 Apr. 2005, which designated the U.S. and claims priority of GB 0407804.4, filed 6 Apr. 2004, the entire contents each of which are hereby incorporated by reference.

This invention relates to a method of manufacture of cadmium mercury telluride, especially to a method of forming cadmium mercury telluride layers that can be used in infrared devices and the cadmium mercury telluride structures so grown.

Cadmium mercury telluride, $Hg_{1-x}Cd_xTe$, is well known as a material for use in infrared devices, such as detectors, sources, LEDs, negative luminescence devices etc. Cadmium mercury telluride, referred to as CMT (or sometimes MCT) is a semiconductor alloy, the bandgap of which can be varied by altering the composition of the alloy, i.e. the cadmium content x. The band gap may be tuned so that CMT can be used for a range of infrared devices covering short wave (SW), medium wave (MW), long wave (LW) and very long wave (VLW) infrared wavelengths. CMT is the material of choice for many infrared focal plane array applications. Low leakage current and high carrier mobility result in detectors with excellent sensitivity. CMT is the best solution for single and multi-band systems covering a wide range of wavelengths because it is possible to tune the wavelength by selecting the appropriate composition and it is possible to design and grow structures where the composition is tuned so that two or more wavelengths are operational within a single device.

The general principle for fabricating infrared devices is well established. CMT is grown epitaxially onto a crystalline substrate. Devices are then formed by Mesa etching, ion implantation or ion beam milling. Metal contacts are then formed and the devices bonded to a silicon read out circuit. Note that CMT is also grown as bulk crystals from which devices are made by ion implantation or ion beam milling but epitaxial growth can be advantageous over bulk crystal growth.

Various epitaxial growth methods have been suggested for fabricating CMT. Metal-organic vapour phase epitaxy (MOVPE) has been successfully used as a technique for reproducible and uniform growth over large areas. U.S. Pat. No. 4,650,539 describes manufacture of CMT using MOVPE. U.S. Pat. No. 4,566,918 is a modification of this technique which grows thin layers of CdTe and HgTe which interdiffuse to form a uniform CMT structure. U.S. Pat. No. 4,950,621 describes a MOVPE technique for CMT growth which uses a photocatalytic decomposition of the metal-organic compounds.

Other methods for growing CMT include molecular beam epitaxy (MBE). Infrared devices have been formed from CMT grown on a cadmium zinc telluride ($Cd_{1-y}Zn_yTe$ also known as CZT) substrate by an MBE process. See for example; M Zandian, J D Garnett, R E Dewames, M Carmody, J G Pasko, M Farris, C A Cabelli, D E Cooper, G Hildebrandt, J Chow, J M Arias, K Vural and D N B Hall, J. Electronic Materials 32(7) 803 (2003) "Mid-wavelength infrared p-on-n $Hg_{1-x}Cd_xTe$ heterostructure detectors: 30-120 Kelvin state of the art performance", or J D Phillips, D D Edwall and a D L Lee J. Electronic Materials 31(7) 664 (2002) "Control of very long wavelength infrared HgCdTe detector cut-off wavelength".

Infrared imaging applications increasingly demand large area, two dimensional detector arrays for long range detection and identification. As the physical size of these arrays has increased so the limitations of traditional substrate materials and growth techniques for CMT have become apparent. Cadmium zinc telluride has been widely used as a substrate for CMT growth but is only available in small sizes which limits its usefulness for the production of large arrays. Cadmium telluride, which has likewise been used as a substrate, is also only available in small sizes. Further, both CdTe and CZT are extremely fragile and the crystal quality is not particularly good.

Gallium arsenide (GaAs) substrates are available in relatively large sizes. However as mentioned the devices are usually bonded to a silicon read-out circuit. In operation detectors are often cooled to low temperatures, for example around 80K (although different devices work best at different temperatures) to reduce thermal noise. At the operating temperatures of the detectors the thermal mismatch between the silicon read out circuit and GaAs substrate can cause delamination of the infrared devices from the circuitry. This effect can be reduced by thinning the substrate but thinning processes can be complex, reducing yields and increasing production costs. This problem of thermal mismatch also applies to cadmium telluride and CZT substrates.

Were silicon to be used as a substrate, the substrate would inherently be thermally matched to the read out circuitry, however, to date, it has proved extremely difficult to produce arrays of working CMT devices on a silicon substrate. For example, individual working LW detector devices have been produced on silicon substrates with good performance but arrays of such devices contain few good working detectors i.e. the operability of the array is very poor.

Silicon has a further advantage as a substrate in that it has a high thermal conductivity. This leads to faster cool down to device operating temperatures which is especially useful for detectors. It is also beneficial for effective removal of heat from infrared sources.

MBE techniques have been applied to growing CMT on silicon, growing buffer layers on the silicon prior to CMT growth, for example;—T. J. de Lyon, J. E. Jensen, M. D. Gorwitz, C. A. Cockrum, S. M. Johnson and G. M. Venzor, J. Electronic. Materials. 28, 705 (1999). MBE growth of CMT on silicon has proved a challenging task. Firstly, for MBE growth of CMT on any substrate the growth temperature must be accurately controlled, requiring reproducible wafer mounting techniques and fine substrate temperature control. Secondly, material defects have proved difficult to eliminate. These defects do not always have a severe effect on medium wavelength infrared device characteristics (depending on the device) but they do detrimentally affect long-wavelength devices. Consequently growth of CMT on silicon by MBE is a difficult process and has only produced acceptable mid-wavelength infrared devices and arrays.

MOVPE growth of CMT on silicon to produce working devices has also been problematic. See J Electronic Materials 25(8) (1996) page 1347 K Shigenaka, K Matsushita, L Sugiura, F Nakata and K Hirahara, M Uchikoshi, M Nagashima and H Wada "Orientation dependence of HgCdTe epitaxial layers grown by MOCVD on silicon substrates", page 1.353 K Maruyama, H Nishino, T Okamoto, S Murakami, T Saito, Y Nishijima, M Uchikoshi, M Nagahima and H Wada "Growth of (111) HgCdTe on (100) Si by MOVPE using metal organic tellurium absorption and annealing", or Page 1358 H Ebe, T Okamoto, H Nishino, T Saito and Y Nishijima, M Uchikoshi, M Nagashima and H Wada "Direct growth of CdTe on (100), (211), and (111) Si by metal organic chemical vapour deposition".

There is therefore a desire for a method of growing CMT on a variety of substrates, especially silicon. Further it is desired that reproducible, large scale growth can be achieved and that the properties of the CMT can be controlled to give wavelength specific performance. It also obviously wished that the method be part of a viable process of fabricating working infrared devices.

It is an object of the invention to provide a method of manufacture of CMT which meets at least some of these aims.

Thus according to the present invention there is provided a method of growing cadmium mercury telluride, $Hg_{1-x}Cd_xTe$ where $0 \leq x \leq 1$, comprising the steps of taking a crystalline substrate, growing at least one buffer layer on said substrate by molecular beam epitaxy and subsequently growing at least one layer of cadmium mercury telluride on said at least one buffer layer by metal-organic vapour phase epitaxy.

The present invention therefore is a combination of MBE and MOVPE techniques. At least one buffer layer is grown on the substrate material by MBE. CMT is then grown on top of the at least one buffer layer using an MOVPE technique. The buffer layers can prevent chemical contamination of the CMT layers by atoms in the substrate layer, for instance gallium atoms if the substrate is gallium arsenide, and can relieve lattice mismatch in the CMT layers. The MBE process allows sufficiently thick, good quality buffer layers to be grown which provide a basis for CMT growth. CMT can then be grown on the buffer layers by MOVPE in a controlled, reproducible fashion. Further the at least one buffer layer can protect the substrate during the subsequent MOVPE processing—some substrates are generally not suitable for MOVPE processing because of chemical attack during MOVPE.

The present invention therefore combines both MBE and MOVPE to produce CMT which can be used in devices at a wide range of wavelengths with good qualities. This goes against the conventional thinking in the field which is to seek to use either an all MBE or an all MOVPE process. Whilst the method of the present invention does require two distinct processing steps, adding to the complexity of the method, the present inventors have realised that mixing the two techniques can provide a reliable and controllable process that has produced excellent devices.

As used in this specification the term cadmium mercury telluride means the composition $Hg_{1-x}Cd_xTe$ where x is controlled to lie between 1 and 0 inclusive. When x is 1 the substance is actually cadmium telluride and when x is 0 the material is actually mercury telluride but both shall be included within the term cadmium mercury telluride or CMT for the purposes of this specification.

The substrate could be any suitable crystalline material. The substrate may conveniently be physically robust and, for large area detectors, available in large areas. In some applications it is necessary that the substrate in the final device is transparent to infrared radiation of the appropriate wavelength although this can be achieved by thinning the substrate. Suitable substrate materials include cadmium telluride, zinc telluride, cadmium zinc telluride, cadmium zinc selenide and cadmium zinc selenide telluride (although these are generally not available in large sizes), gallium arsenide, silicon, germanium, indium antimonide, indium aluminium antimonide, indium gallium antimonide, indium phosphide, sapphire, alumina or spinel ($MgAl_2O_4$).

Silicon is a preferred substrate in some embodiments as it is inherently thermally matched with the read-out circuit. The method of the present invention allows device structures to be grown on silicon and tuned to operate at any wavelength across the whole range of infrared wavelengths with very good device performance.

Orientation of the substrate is important in ensuring the correct material growth. The orientation should allow correct growth of the buffer layers by MBE and ensure that the buffer layers have the correct orientation for the growth of CMT by MOVPE. The substrate is therefore preferably arranged to be misaligned from the form {100} in either the <111> or <110> directions. Preferably the degree of misalignment is between 1° and 10°. Mis-aligning the substrate orientation in this way prevents the build up of defects in the MBE buffer layers. When the substrate is silicon the substrate orientation is preferably (001) mis-aligned towards the [111] direction and the degree of mis-alignment is preferably in the range of 1°-10° inclusive. Silicon is generally a more difficult substrate to grow on and correct orientation can be important.

The choice of buffer layer or layers may depend on the substrate used. The buffer layers set the correct orientation for MOVPE growth and prevent chemical contamination of the CMT by species in the substrate. Suitable buffer layers include cadmium telluride and zinc telluride. There may be a single buffer layer, e.g. a single layer of zinc telluride or a combination of layers, for instance a layer of zinc telluride may be grown on the substrate with a layer of cadmium telluride grown on top. Cadmium zinc telluride may also be used as a buffer layer.

To grow zinc telluride either zinc telluride may be used as the MBE source material or elemental zinc and tellurium may be used, or a combination of the elemental and compound materials. Similarly the cadmium telluride may be grown using elemental cadmium and tellurium or cadmium telluride or a combination. The buffer layers are grown using standard MBE growth processes which the skilled person will be aware of.

After the MBE growth of the buffer layers CMT may be grown on the buffer layers by MOVPE. However it may be preferable to clean the surface of the buffer layers prior to MOVPE growth. Depending on the equipment used it may be necessary to transfer the buffered substrate from an MBE growth apparatus to an MOVPE reactor and/or there may be a delay between processing steps. If the buffered substrate is not kept in a controlled environment there may be impurities which build up on the surface of the top buffer layer. Cleaning will remove at least some of these impurities. Cleaning may be performed by etching the buffered substrate as is well understood by one skilled in the art of MOVPE or by any suitable cleaning processes. If a combined MBE/MOVPE system complete with load lock between the two parts is in place cleaning is not needed.

Prior to growing the at least one CMT layer the method may further comprise the step of growing at least one further buffer layer by MOVPE. This MOVPE buffer layer may be the same as or different to a buffer layer material grown by MBE. As mentioned above MBE gives a good controllable way of growing suitable buffer layers on silicon with the correct orientation for MOVPE growth. In order to further improve conditions for MOVPE growth of CMT however it may be useful to lay down a buffer layer by MOVPE. For instance when the MBE buffer layer comprises a top layer of cadmium telluride grown on a base layer zinc telluride on the substrate the method may comprise the step of growing a further cadmium telluride layer by MOVPE on top of the MBE CdTe layer.

Growing a further buffer layer by MOVPE can increase the buffer layer thickness which can be beneficial in some embodiments and MOVPE is a faster growth method than MBE. The MOVPE buffer layers can improve the crystal quality. Further MOVPE buffer layers are also useful in isolating the CMT from the surface which has been exposed to the atmosphere, i.e. laying down an MOVPE buffer layer can cover over any slight surface impurities due to oxidation etc of the MBE buffer layer and any residue of the cleaning process, if performed.

Growth of the CMT layer is by standard MOVPE techniques whereby the concentration of the precursors entering the reactor are controlled by their vapour pressure and the gas flow (conveniently hydrogen) through the bubblers containing the precursors possibly with further dilution by an additional clean gas ($H_2$) flow. In this way $Hg_{1-x}Cd_xTe$ can be grown with a controlled value of x so as to give desired device characteristics. Conveniently the MOVPE process uses the interdiffused multi-layer process of CMT growth as described in U.S. Pat. No. 4,566,918, i.e. the step of growing CMT comprises sequentially growing thin layers of CdTe and HgTe which interdiffuse during growth to give a single layer of CMT, the relative thicknesses of the CdTe and HgTe layers determining the cadmium content x.

The organometallic precursors used are any suitable volatile tellurium and cadmium compounds such as an alkyl of cadmium and of tellurium. In one embodiment the tellurium precursor is di-iso-propyltelluride and the cadmium precursor is dimethylcadmium.

The CMT layer may be doped with a suitable dopant which may be n-type or p-type. Suitable dopants include iodine, arsenic, indium and antimony although other dopants could be used. Suitable precursors include iso-butyliodide and tris (dimethylamino)arsenic.

Generally the method will comprise growing more than one layer of CMT according to the requirements of the intended device. Different layers may have different thicknesses, compositions (x in $Hg_{1-x}Cd_xTe$), and/or different dopants and dopant concentration.

The present invention as mentioned therefore provides a reproducible and effective method of growing controlled cadmium mercury telluride layers which can be used in the production of a wide range of infrared devices. The fabricated layers can be mesa etched, ion beam milled or ion implanted to form devices as is known in the art. The method may include growing one or more capping or contacting layers by MOVPE prior to device formation as would be understood by one skilled in the art. Capping layers may be required if this technique was used for ion milled or ion implanted devices without mesa formation.

Where mesa devices are formed it is preferable that the devices are coated with a passivation layer as will be understood by one skilled in the art. The side walls of the mesa are preferably coated with one or more passivating layers to ensure electrical stability of the device and prevent loss of mercury from the material. Preferably therefore the method includes the step, after device processing, of coating the devices with at least one passivating layer. The passivating layer may conveniently be a layer of cadmium telluride. Conveniently the passivating layer is an epitaxial layer grown by MOVPE.

For the purposes of this specification the term device processing may include any steps applied to the CMT material after the initial CMT growth, i.e. any interruption to the step of growing CMT by MOVPE, in particular steps such as etching which leave a non-planar CMT surface.

The use of MOVPE for growing passivation layers is another novel aspect of the invention. Conventional passivation layers are evaporated layers applied for instance by MBE or more usually in an evaporator.

The use of MOVPE for device passivation can be advantageous in several regards. First dry etching of mesa devices can result in devices with steep side walls and MBE techniques can increasingly fail to cover the side walls because the beams of material are parallel to the side walls rather than perpendicular.

The MOVPE process, based on gases which are easily able to penetrate the channels between the mesas, is much better at coating such devices.

Further passivation layers such as cadmium telluride grown by MOVPE are epitaxial with the CMT layers and crystalline, whereas MBE and evaporated CdTe is poly-crystalline.

In fact the ability to grow further epitaxial layers after device processing is a further novel aspect of the invention. This allows for the growth of further CMT layers after device processing. Therefore the method may advantageously comprise the step, after device processing, of growing further epitaxial layers of CMT by MOVPE. The present method therefore allows CMT samples to be removed from the MOVPE reactor, put through device processing stages, replaced into the MOVPE reactor and have further CMT layers grown thereon. Depending on the processing and handling of the samples cleaning may be required after the device processing stages.

The fabricated devices can then have contacts provided and bonded to a read-out circuit. Where silicon is used as a substrate this results in a device having a thermally matched and IR transparent substrate without the need for thinning processes. Furthermore the present invention provides a means for producing infrared devices on a silicon substrate that work at long wave (>8 μm) infrared wavelengths.

The devices enabled by the present invention include Short wave detectors and sources, Medium wave detectors and sources, Long wave detectors and sources and Very longwave detectors and sources. Dual band, Multi-band, hyperspectral and avalanche devices can be produced using CMT grown by the present invention. Negative luminescence devices can be fabricated as can LEDs and single photon sources and the devices can be used in a range of technology from focal plane array infrared detectors to gas sensors. Transistors can also be fabricated using the method of the present invention.

It will be apparent that the invention involves use of two distinct processes, MBE for production of the buffer layers on the substrate, and MOVPE for growth of any additional buffer layers, CMT layers and passivating layers. These two processes may be performed in different pieces of apparatus at different times although as mentioned a buffered substrate not kept in a protected environment prior to MOVPE may need cleaning.

Therefore in a second aspect of the invention there is provided a method of producing a buffered substrate suitable for growth of at least one layer of cadmium mercury telluride by, metal organic vapour phase epitaxy the method comprising the steps of taking a crystalline substrate and growing at least one buffer layer by molecular beam epitaxy. The second aspect of the invention therefore provides a suitable buffered substrate that can be used in the controlled growth of CMT by MOVPE. All of the embodiments of the first aspect of the invention with respect to the growing of the MBE buffer layers, are applicable to the second aspect of the invention. In particular, preferably the substrate is mis-aligned from the {100} form towards <111> or <110>. Preferably the substrate is silicon and the orientation is preferably (001) mis-aligned from 1° to 10° to <111>.

Preferably prior to growth of the buffer layer or layers the method includes the step of cleaning and/or treating/preparing the substrate. The method of cleaning the substrate may include the step of heating the substrate under an arsenic flux. Arsenic is a preferred material for the cleaning flux but other materials or combinations thereof could be used instead or in addition such as, cadmium, zinc, tellurium, cadmium telluride, zinc telluride, antimony or phosphorous.

In a third aspect of the invention there is provided a method of manufacture of cadmium mercury telluride comprising the steps of taking a buffered substrate comprising one or more buffer layers grown on a crystalline substrate by molecular beam epitaxy and growing at least one layer of cadmium mercury telluride by metal organic vapour phase epitaxy. Thus the third aspect of the invention takes a buffered substrate, such as may be produced by a first aspect of the invention, and grows at least one layer of CMT as required for a particular device. All the embodiments described above with respect to the first aspect of the invention concerning growth of the CMT layers, possible cleaning of the buffered substrate and possible growth of further buffer layers by MOVPE are applicable to the third aspect of the invention.

Because the present invention enables production of CMT for use in infrared devices, e.g. detectors or sources, across the whole range of infrared wavelengths and also enables use of previously difficult substrate materials the present invention allows novel devices to be produced.

Therefore in a further aspect of the invention there is provided an infrared device comprising a substrate, at least one buffer layer on the substrate and at least one layer of cadmium mercury telluride on the at least one buffer layer wherein the substrate orientation is {100} mis-aligned by 1°-10° inclusive to <110> or <111>. In this context the term device refers to a material arrangement which is capable of being used as an infrared device when connected to suitable circuitry, for example a detector element in a focal plane array—i.e. it would function as a detector element when formed with appropriate contacts etc. The novel device of the present invention is preferably produced by the method of the present invention and so all of the advantages and embodiments of the methods mentioned above are applicable. In particular the substrate may be silicon and have an orientation (001) mis-aligned by 1°-10° inclusive to [111] and the at least one buffer layer may comprise one or more layer chosen from zinc telluride, cadmium telluride and cadmium zinc telluride.

In another aspect of the invention there is provided an infrared device comprising a substrate, at least one buffer layer formed on the substrate and at least one layer of cadmium mercury telluride formed on the at least one buffer layer wherein the at least one layer of cadmium mercury telluride is tuned to be active at long wave infrared wavelength radiation and wherein the substrate is silicon. As used above the term active shall be taken to mean that the CMT is tuned to either detect or to emit long wavelength infrared radiation. As mentioned above fabrication of an array of working long wavelength infrared CMT detectors on silicon has previously not been possible. In the context of this specification the term long wave infrared shall be taken to mean a cut off wavelength of greater than 8 μm. The present invention has also allowed production of long wavelength infrared luminescent sources on silicon with excellent performance.

As mentioned above the epitaxial growth of further CMT layers on CMT after device processing is another novel aspect of the invention. Therefore in another aspect of the invention there is provided a method of growing at least one crystalline layer of $Hg_{1-x}Cd_xTe$ where $0 \leq x \leq 1$ comprising the step of taking a substrate having at least one mesa device formed in at least one layer of cadmium mercury telluride and growing said at least one layer of $Hg_{1-x}Cd_xTe$ by MOVPE.

Figure 4:
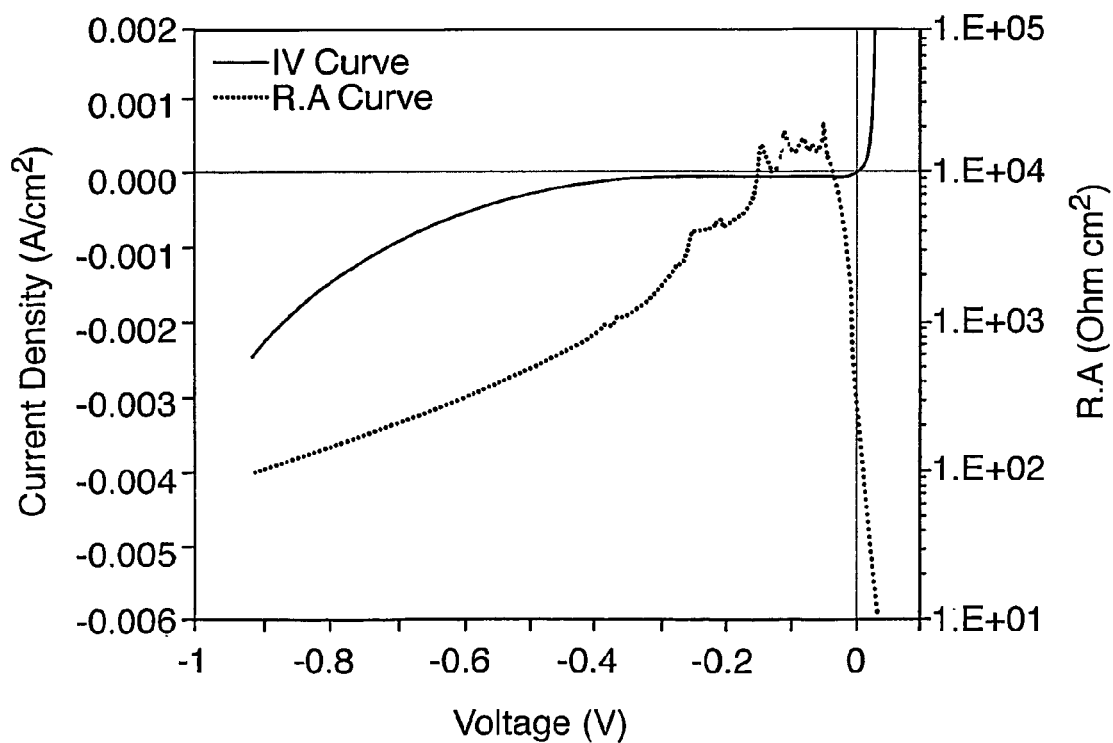
Figure 2:
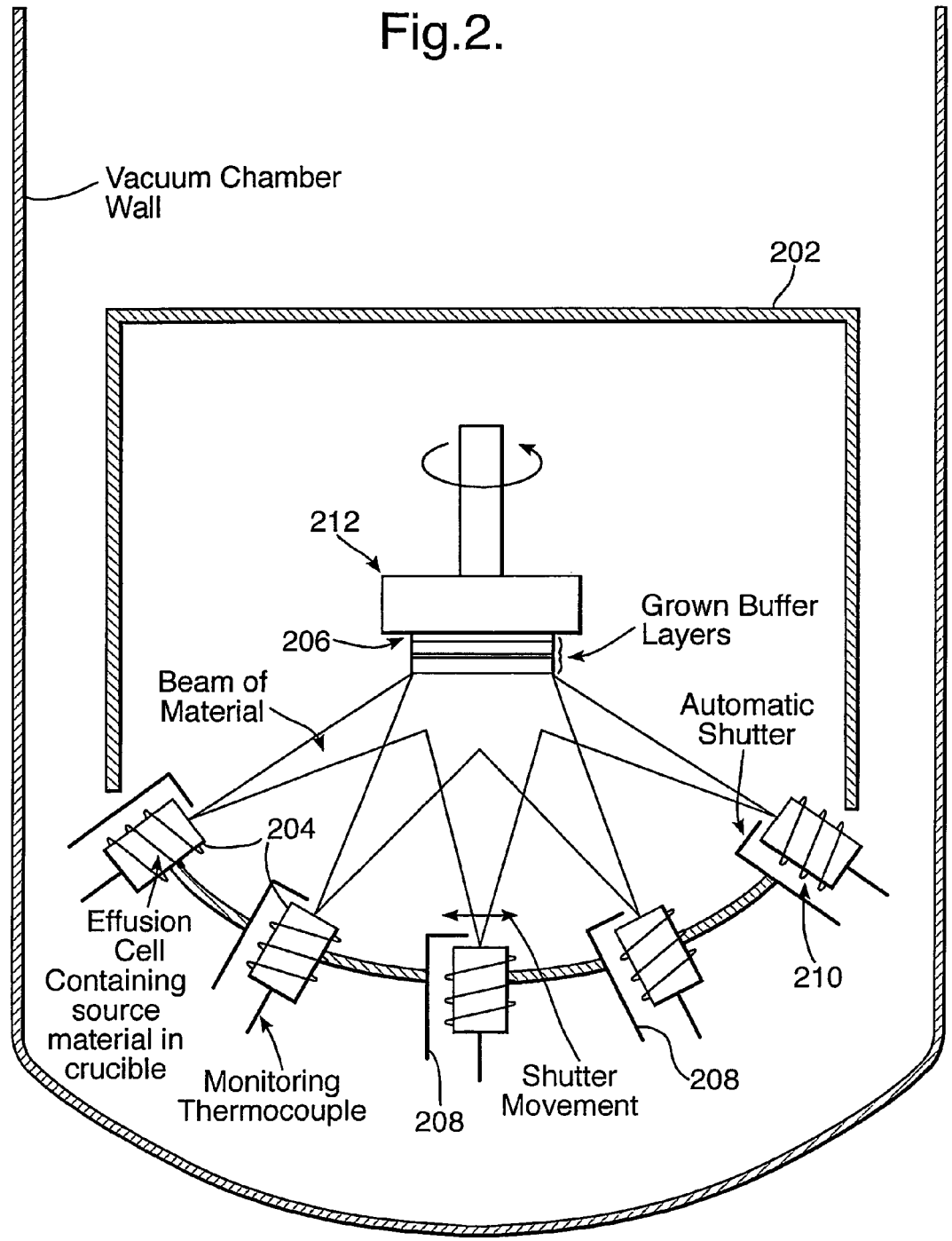
Figure 3:
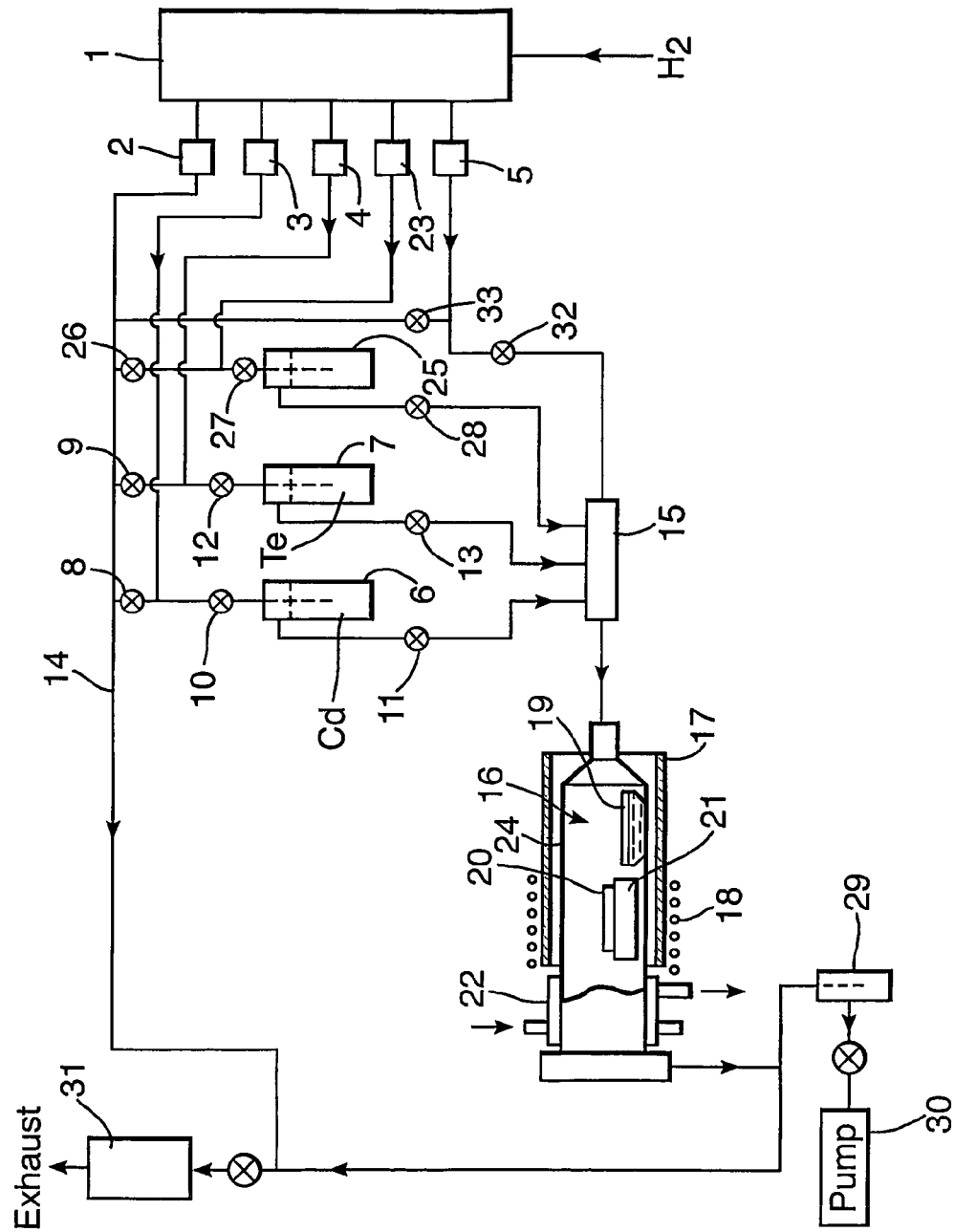
Figure 5:
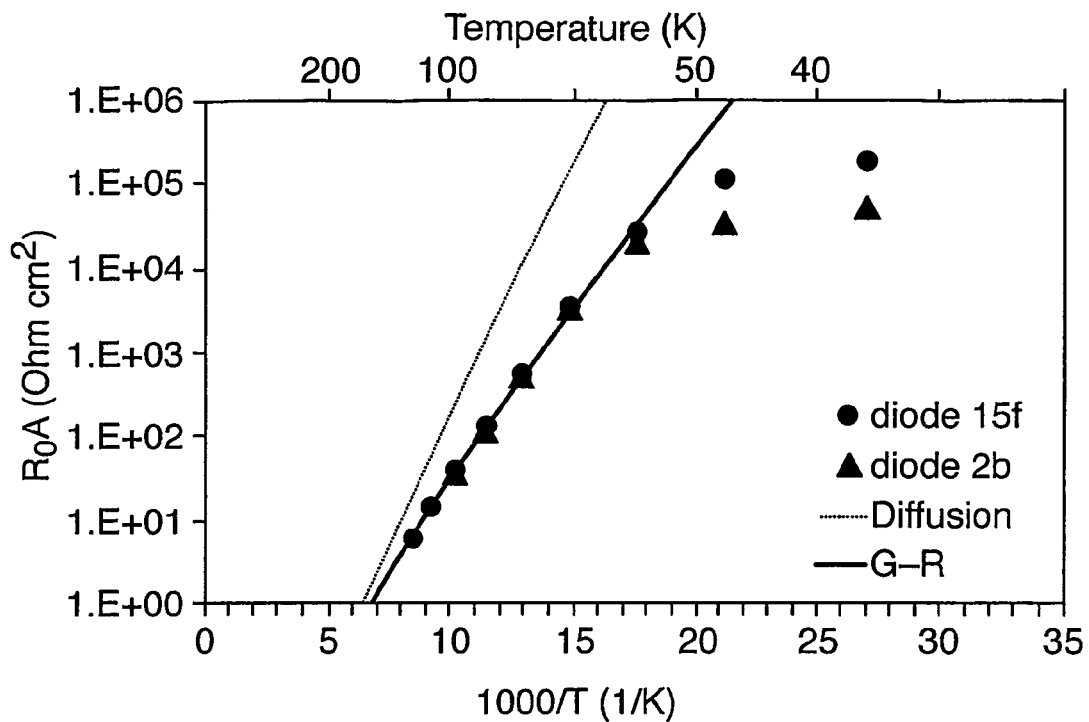
Figure 6:

The invention will now be described by way of example only with reference to the following drawings of which;

FIG. 1 shows a typical infrared detector arrangement according to the present invention, FIG. 2 shows a generic MBE apparatus that illustrates the principles of MBE, FIG. 3 shows a generic MOVPE apparatus that illustrates the principles of MOVPE, FIG. 4 shows a resistance-area and current-voltage plot at 80K for a device as shown in FIG. 1 fabricated using the method of the present invention, FIG. 5 shows a plot of $R_0A$ as a function of temperature for two diodes at opposite sides of a 128×128 array fabricated using the method of the present invention, and FIG. 6 shows an infrared image from a 128×128 long wave CMT array on silicon Referring to FIG. 1 a typical infrared diode fabricated according to the method of the present invention is shown. The device comprises a silicon substrate 102 having two buffer layers 104, 106. Buffer layer 104 is a thin layer of zinc telluride and buffer layer 106 a thicker layer of cadmium telluride although other buffer layers could be used as will be described.

The device then has three different CMT layers 108, 110, 112. CMT layer 108 is a $p^+$ doped contact layer. Layer 110 is an $n^-$ doped absorbing layer and uppermost CMT layer 112 is an $n^+$ contact layer. Formed on uppermost CMT layer 112 is a metal contact 114 and an indium bump 116 for bump bonding to some read out circuitry. A passivation layer of cadmium telluride 118 is provided over the area of the top CMT layer 112 which is not covered by the metal contact 114. The device therefore exhibits an n-on-p diode structure as will be understood by one skilled in the art. Alternatively a p-on-n structure could be produced by simply reversing the order of layers 108, 110 and 112.

The device shown in FIG. 1 may be fabricated using the novel method of the present invention as will be described. First a silicon wafer of the required size is taken and prepared. Silicon is a preferred substrate material as it is transparent to infrared radiation, available in large wafers, of high thermal conductivity, robust and, being silicon, is thermally matched to the read-out circuit. Hence the use of silicon substrate eliminates stresses caused by thermal mis-match when the devices are cooled to the operating temperature (e.g. around 80K). However other substrate materials could be used such as cadmium telluride, zinc telluride, cadmium zinc telluride, cadmium zinc selenide, CdSeTe, CdZnSeTe and similar, gallium arsenide, germanium, indium antimonide, indium aluminium antimonide, indium gallium antimonide, indium phosphide, sapphire, alumina or spinel.

The silicon wafer is cut so that the orientation is (001) mis-aligned by 1° to 10° towards [111]. CMT grown on buffer layers on silicon at the {100} orientation has a tendency to form domains and hillock defects. However the present inventors have found that a mis-orientation from (001) of a few degrees towards [111] can eliminate the domains and therefore reduce defects.

The silicon substrate is then etched in hydrofluoric acid/ethanol to leave a hydrogen terminated surface and blown dry with inert gas. Etching may also be carried out using the REOX process. The substrate is then ready to be loaded into the MBE chamber.

MBE is a process which takes place in ultra high vacuum. Referring to FIG. 2, the liquid nitrogen 202 shroud assists with maintaining the vacuum. The source materials are contained in crucibles inside effusion cells (204) within the machine.

The effusion cells (204) are positioned so that the open ends of the crucibles point at a heated substrate (206). Material is transferred from the crucible to the heated substrate when a shutter (208) over the end of the crucible is removed.

The amount of, material which is transferred to the substrate is dependent upon the temperature of the crucible, the higher the temperature the higher the vapour pressure of the material and hence the more material is transferred. The heating coils 210 control heating of the crucibles. Because the system is under vacuum, even low vapour pressure materials evaporate if heated sufficiently and can be transferred to the substrate. Again because the system is under vacuum, beams of material are transferred from the effusion cells to the sample without interference from ambient gas. The effusion cells are normally held at an idling temperature where they are kept warm but not hot enough to evaporate material. Before growth is started the cells are warmed to their growth temperature so that sufficient material can evaporate from the crucible to grow the desired layer.

The etched silicon substrates 206 are loaded into the MBE kit via a load lock. The substrate is clipped onto a holder 212 which is heated and also rotates. Rotation assists with the uniformity of the grown layers. The temperature of the substrate during growth is below that at which the deposited material re-evaporates, but is sufficiently hot to allow the atoms to move around on the surface and form crystalline material.

It has been found that it may be beneficial to use an MBE kit which has previously been used to grow the required buffer layers. The effect of previous growth runs may be to condition the MBE kit so as to allow subsequent high quality crystalline growth. With a "clean" MBE kit it may therefore be beneficial to perform a couple of conditioning growth runs first.

Once loaded in the chamber the etched substrate is treated at temperature under an arsenic flux. The substrate is heated under the arsenic flux to a higher temperature than the growth temperature. The arsenic flux is initiated by removing the shutter from the front of the arsenic cell and terminated by replacing the shutter and removing any excess arsenic pressure from the chamber. The temperature is lowered to the growth temperature and zinc telluride growth initiated by removing the shutters from in front of the zinc telluride, zinc and tellurium cells as necessary depending on which sources are to be used for the growth. Once the required thickness of zinc telluride has been grown, the shutters are replaced. Likewise the cadmium telluride is grown by removing the shutters from in front of the cadmium telluride, cadmium and tellurium cells as necessary. Again at the end of CdTe growth the shutters are replaced. Once growth is completed, the cells are cooled to the idle temperature and the substrate is cooled and unloaded from the machine.

A thin buffer layer of ZnTe is grown on the silicon substrate by MBE to set the substrate orientation to (001) and to improve adhesion of the CdTe buffer layer which is then subsequently grown. CdTe grown directly on silicon by MBE is more prone to flaking from the substrate. However for some substrates adhesion is not a problem and a single or base layer of CdTe could be used (e.g. on GaAs substrates). Also for some devices a single layer of ZnTe suffices without an additional CdTe layer. The buffer layers preferably have a total thickness of around 8 µm as crystal quality can increase with thickness to about 8 µm. However MBE is a relatively slow process and so a thickness less than 8 µm may be acceptable.

Part of the growth process may be carried out using migration enhanced epitaxy (MEE) and for the purposes of this specification references to MBE include references to MEE.

The CdTe/ZnTe/Si is then transferred to the MOVPE reactor with any etching/cleaning steps as necessary being performed. To produce the device shown in FIG. 1 three CMT layers are grown, each layer being grown by the interdiffused multi-layer process described in U.S. Pat. No. 4,566,918. Whilst MBE apparatus and MOVPE apparatus are often separate pieces of equipment there is no reason why they could not be combined in a single unit with a load lock or transfer mechanism between the two a particular piece of kit could not be arranged with MBE and MOVPE chambers and a load lock or transfer mechanism between the two.

FIG. 3 illustrates the principles of MOVPE growth and shows an apparatus suitable for MOVPE growth although the actual apparatus used may vary. As described more fully in U.S. Pat. No. 4,566,918 a supply of hydrogen is supplied via mass flow controllers 3, 4 and 23 from manifold 1 to bubblers 6, 7 and 25. With valve 8 closed and valves 10 and 11 open gas flows through bubbler 6 whereas with valves 10 and 11 closed and valve 8 open the hydrogen flow from mass flow controller 2 is directed via bypass line 14 to a scrubber or filter 31. Similarly bubbler 7 can be controlled by valves 9, 12 and 13 and bubbler 25 controlled by valves 26, 27 and 28. Only three bubblers are shown in FIG. 3 for simplicity although more bubblers may be needed in practice. Thus the flow through each bubbler can be controlled. The flow from bubblers 6, 7 and 25 may be mixed in mixer 15 where it may be diluted with gas flow from controller 5 (controlled by valves 32, 33) before entering reactor vessel 16 although in other arrangements it may be preferred to supply the precursors separately to the reactor vessel and mix them in the reactor.

The buffered substrate 20 is located in the reactor vessel 16 on susceptor 21. A bath of elemental mercury 19 is heated by heating element 17 via reactor wall 24 or any suitable heating means, such as internal cartridge heaters located under the mercury bath, and maintains a partial pressure of mercury vapour. The buffered substrate is heated by induction heater 18 or heated by any other suitable means so that the metalorganic precursors in the gas streams from the bubblers 6, 7 and 25 decompose in the vicinity of the substrate.

Bubbler 6 contains a precursor of cadmium such as dimethylcadmium and bubbler 7 contains a precursor of tellurium such as di-iso-propyltelluride. The gas flow from bubblers 6 and 7 to the reactor chamber is controlled sequentially by appropriate control of the valves to grow thin layers of mercury telluride and cadmium telluride, the thickness of the layers being controlled to control the overall cadmium content of the final CMT layer which is formed by interdiffusion of the layers during the growth process.

To produce the first $p^+$ CMT layer a p-type dopant should be introduced. A suitable p-type dopant is arsenic although other dopants could be considered such as phosphorus and antimony. Therefore the dopant bubbler 25 contains a suitable precursor such as tris(dimethyl)aminoarsenic (other volatile arsenic components could be used) and the bubbler temperature and gas flow through this bubbler is controlled to give the appropriate doping. After the first CMT layer has been grown the other CMT layers can be grown in sequence. A suitable n-type dopant for the n-type layers is iodine with say isobutyliodide as the precursor although other precursors could be used and indeed other dopants such as indium could be used. As mentioned where different dopants are used the MOVPE apparatus would have a plurality of dopant bubblers which could be separately controlled rather than the single dopant bubbler shown in FIG. 3. Similarly if any MOVPE buffer layers are to be grown the apparatus may contain bubblers holding precursors for the buffer layer constituents.

Following growth of the CMT layers by MOVPE it is preferable to anneal the material in a mercury rich environment—this fills the mercury vacancies and ensures the desired electrical properties. The annealing may be carried out in a MOVPE reactor and may be performed directly after growth of the CMT layers or it may be performed later using any suitable apparatus.

Some two-dimensional arrays of 128×128 detectors on a 55 μm pitch were fabricated from CMT material grown as described above and tuned to long wave infrared wavelength operation. Individual diodes were formed by wet etching mesas using hydrobromic acid. A thin crystalline CdTe passivation layer was deposited by MOVPE.

Dry etching can also be used; dry etched mesas have much deeper and narrower trenches between the mesas and the use of the gas phase MOVPE process is a considerable advantage in passivation as the gas can more easily penetrate the narrow trenches. The use of MOVPE for growth of the passivation layer also results in a more robust crystalline CdTe layer unlike the polycrystalline layers formed using conventional MBE passivation layers. Windows were etched in the passivation before metal contact and indium bump deposition—FIG. 1 refers. One array was flip chip bonded to a silicon leadout chip to measure device characteristics and another to a readout chip to realise an imaging array of detectors.

The cadmium composition (x in $Hg_{1-x}Cd_xTe$) of the absorbing layer was set to correspond to a 10.2 μm cut-off wavelength where cut off is defined as 50% of the maximum response. The diode characteristics were measured as a function of temperature in a cryostat with effectively zero field of view (FOV). The 80K current-voltage (I-V) and resistance-area product (R.A) of one of the diodes in the array is shown in FIG. 3. The R.A at zero voltage $R_0A$ and $R_{max}A$ are high for a device with this cut-off wavelength (~$10^3$ Ohm-cm$^2$ and ~$10^4$ Ohm-cm$^2$ respectively). The breakdown characteristics are also excellent, with the R.A value above ~$10^2$ Ohm-cm$^2$ at 1V reverse bias.

A plot of $R_0A$ as a function of temperature for two diodes located at opposite ends of the array is shown in FIG. 4. The expected diffusion and generation-recombination (G-R) limited $R_0A$ curves for these devices are also shown. The $R_0A$ values from both diodes are similar for temperatures down to 60K indicating that the CMT composition, doping profiles, passivation and fabrication are uniform across the array.

The image from the array bonded to the readout circuit (FIG. 6) is comprised of 99.7% working detectors. This is the highest reported operability for a long wave CMT array grown on a silicon substrate.

Although in the example given above there was only one growth step of CMT by MOVPE followed by device processing and then MOVPE growth of a passivation layer this later growth step could include growth of further epitaxial, crystalline CMT layers. This allows the formation of complex devices and structures that were previously unachievable. The further CMT layers could then be subjected to further device processing steps as required with further re-growth of CMT or passivation layers.

The invention claimed is:

1. A method of fabricating an infrared device comprising a cadmium mercury telluride, $Hg_{1-x}Cd_xTe$ where x is 0<x<1, device layer, the method comprising the steps of:
   a) taking a crystalline silicon substrate,
   b) growing one or more buffer layers selected from zinc telluride, cadmium telluride and cadmium zinc telluride on said substrate by molecular beam epitaxy to form a buffered silicon substrate, and
   c) growing at least one device layer of cadmium mercury telluride on the buffered silicon substrate by metal-organic vapour phase epitaxy.

2. A method as claimed in claim 1 wherein the step of growing at least one buffer layer by molecular beam epitaxy comprises the step of growing a layer of zinc telluride on the substrate and growing a layer of cadmium telluride on said zinc telluride layer.

3. A method as claimed in claim 1 further comprising the step, prior to the step of growing the at least one layer of cadmium mercury telluride, of cleaning the surface of the uppermost buffer layer grown by molecular beam epitaxy.

4. A method as claimed in claim 1 wherein the method further comprises the step, after growing at least one buffer layer by molecular beam epitaxy, of growing at least one buffer layer by metal organic vapour phase epitaxy.

5. A method as claimed in claim 4 wherein at least one buffer layer grown by metal organic vapour phase epitaxy step is the same as a buffer layer grown by molecular beam epitaxy.

6. A method as claimed in claim 5 wherein the step of growing at least one buffer layer by molecular beam epitaxy comprises growing a top layer of cadmium telluride on a base layer zinc telluride on the substrate the step of growing at least one further buffer layer comprises growing a further cadmium telluride layer by metal organic vapour phase epitaxy.

7. A method as claimed in claim 1 wherein the step of growing the at least one cadmium mercury telluride layer comprises sequentially growing thin layers of CdTe and HgTe which interdiffuse during growth to give a single layer of CMT, the relative thicknesses of the CdTe and HgTe layers determining the cadmium content x.

8. A method as claimed in claim 1 wherein di-iso-propyl-telluride is the tellurium precursor and dimethylcadmium is the cadmium precursor in the step of growing the at least one cadmium mercury telluride layer by MOVPE.

9. A method as claimed in claim 1 wherein the step of growing the at least one cadmium mercury telluride layer involves doping at least one of the cadmium mercury telluride layers with a dopant.

10. A method according to claim 9 wherein the dopant is chosen from iodine, arsenic, indium, phosphorous and antimony.

11. A method according to claim 1 wherein the step of growing at least one cadmium mercury telluride layer comprises the step of growing a plurality of layers of cadmium mercury telluride, at least some of the layers having a different thickness, composition, dopant and/or dopant concentration.

12. A method according to claim 1 wherein the method further comprises the step of device processing.

13. A method according to claim 12 wherein the method comprises the step, after the device processing step, of coating the devices with at least one passivating layer.

14. A method according to claim 13 wherein the at least one passivating layer comprises cadmium telluride.

15. A method according to claim 13 wherein the step of coating the device with a passivating layer comprises growing at least one epitaxial layer grown by metal organic vapour phase epitaxy.

16. A method according to claim 12 wherein the method involves the step, after the device processing step, of growing further epitaxial layers of cadmium mercury telluride by metal organic vapour phase epitaxy.

17. A method as claimed in claim 1 wherein the silicon substrate orientation is (001) mis-aligned between 1° and 10° towards the [111] direction, and wherein the buffer layer sets the substrate orientation to (001).

18. A method of fabricating an infrared device comprising a cadmium mercury telluride, $Hg_{1-x}Cd_xTe$ where x is $0<x<1$, device layer, the method comprising the steps of:
 a) taking a crystalline silicon substrate in which the orientation is (001) mis-aligned between 1° and 10° towards the [111] direction,
 b) growing one or more buffer layers selected from zinc telluride, cadmium telluride and cadmium zinc telluride on said substrate by molecular beam epitaxy to form a buffered silicon substrate and to set the substrate orientation to (001), and
 c) growing at least one device layer of cadmium mercury telluride on the buffered silicon substrate by metal-organic vapour phase epitaxy.

* * * * *